US006372574B1

(12) United States Patent
Lane et al.

(10) Patent No.: US 6,372,574 B1
(45) Date of Patent: Apr. 16, 2002

(54) METHOD OF FORMING A CAPACITOR CONTAINER ELECTRODE AND METHOD OF PATTERNING A METAL LAYER BY SELECTIVELY SILICIZING THE ELECTRODE OR METAL LAYER AND REMOVING THE SILICIZED PORTION

(75) Inventors: Richard H. Lane; Fred Fishburn, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/586,321

(22) Filed: Jun. 2, 2000

(51) Int. Cl.[7] .......................................... H01L 21/8242
(52) U.S. Cl. ...................... 438/253; 438/244; 438/386; 438/387; 438/396; 438/669; 438/957
(58) Field of Search ................................ 438/244, 253, 438/386, 387, 396, 669, 705, 720, 754, 682, 686, 957, 963, 3; 216/6, 55, 100

(56) References Cited

U.S. PATENT DOCUMENTS 5,053,105 A  * 10/1991  Fox, III ........................ 216/40
5,587,338 A  * 12/1996  Tseng .......................... 438/672
5,976,928 A  * 11/1999  Kirlin et al. ................. 438/240
6,133,129 A  * 10/2000  Xiang et al. ................. 438/585
6,136,659 A  * 10/2000  Schindler et al. ............ 438/386

* cited by examiner

*Primary Examiner*—Caridad Everhart
*Assistant Examiner*—Craig P. Lytle
(74) *Attorney, Agent, or Firm*—Wells St. John P. S.

(57) ABSTRACT

A method of patterning a metal layer includes masking a first portion of a metal layer while leaving a second portion of the metal layer unmasked over a substrate. With the masking in place, the second portion is reacted with silicon to form a metal silicide from the metal layer. The metal silicide is removed from the substrate while substantially leaving the first portion on the substrate. The masking is removed from the substrate. A method of patterning a metal layer includes depositing and patterning a silicon comprising layer over a substrate. A metal layer is formed over the patterned silicon comprising layer, and includes a portion extending to elevationally inward of the metal layer. Metal of the metal layer is reacted with silicon of the silicon layer to form a metal silicide and leave at least some of the portion unreacted. The metal silicide is removed from the substrate while substantially leaving the unreacted portion of the metal layer on the substrate. These and other implementations can be used to form capacitor container electrodes and other circuit devices.

74 Claims, 7 Drawing Sheets

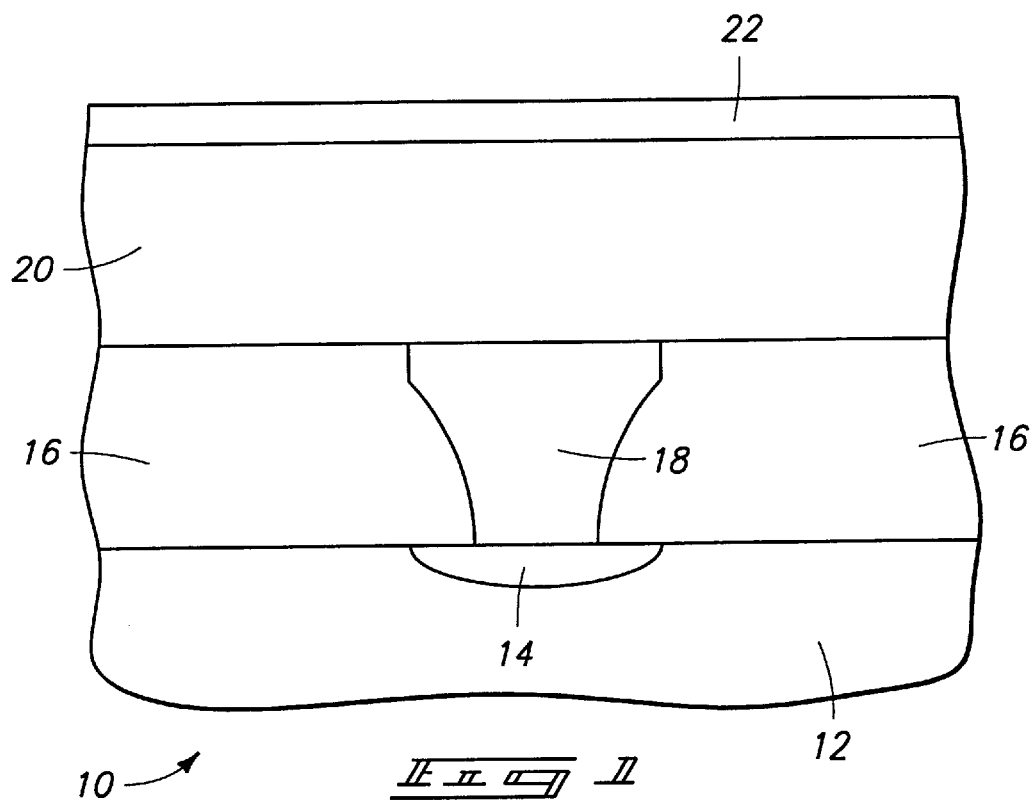
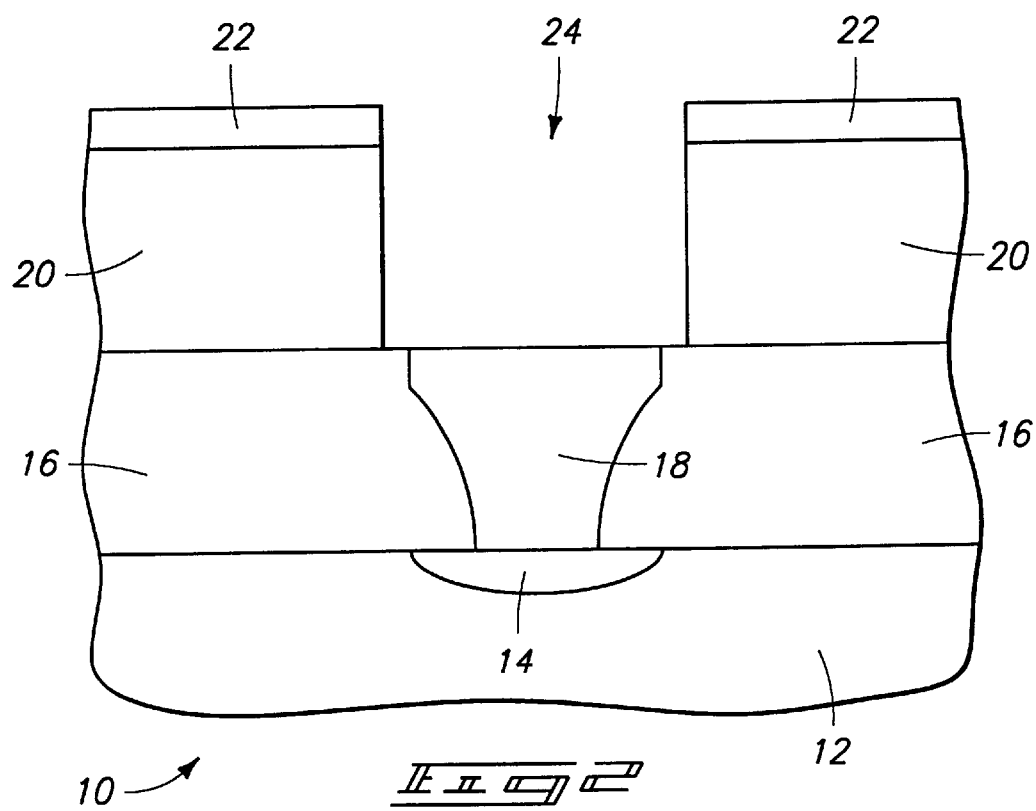

METHOD OF FORMING A CAPACITOR CONTAINER ELECTRODE AND METHOD OF PATTERNING A METAL LAYER BY SELECTIVELY SILICIZING THE ELECTRODE OR METAL LAYER AND REMOVING THE SILICIZED PORTION

TECHNICAL FIELD

This invention relates generally to methods of forming capacitor container electrodes and to methods of patterning metal layers.

BACKGROUND OF THE INVENTION

One common goal in capacitor fabrication is to maximize the capacitance for a given size capacitor. It is desirable that stored charge be at a maximum immediately at the physical interface between the respective electrodes or capacitor plates and the capacitor dielectric material between the plates. Typical integrated circuitry capacitors have electrodes or plates which are formed from doped semiconductive material such as polysilicon. The polysilicon is usually heavily doped to impart a desired degree of conductivity for satisfactory capacitor plate operation.

One drawback of heavily doping polysilicon is that during operation a charge depletion region develops at the interface where charge maximization is desired. Hence, a desired level of charge storage is achieved at a location which is displaced from the interface between the capacitor plate and the dielectric material. Another drawback of heavily doped polysilicon capacitor plates is that during processing, some of the dopant can migrate away from the polysilicon and into other substrate structures. Dopant migration can adversely affect the performance of such structures. For example, one type of integrated circuitry which utilizes capacitors are memory cells, and more particularly dynamic random access memory (DRAM) devices. Migratory dopants from doped polysilicon capacitor plates can adversely impact adjacent access transistors by undesirably adjusting the threshold voltages.

As the memory cell density of DRAMs increases there is a continuous challenge to maintain sufficiently high storage capacitance despite decreasing cell area. Additionally there is a continuing goal to further decrease cell area. The principal way of increasing cell capacitance heretofore has been through cell structure techniques. Such techniques include three dimensional cell capacitors such as trench or stacked capacitors.

Highly integrated memory devices, such as 256 Mbit DRAMs and beyond, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness. Insulating inorganic metal oxide materials, such as $Ta_2O_5$ and barium strontium titanate, have high dielectric constants and low leakage current which make them attractive as cell dielectric materials for high density DRAMs and non-volatile memories. All of these materials incorporate oxygen and are otherwise exposed to oxygen and anneal for densification to produce the desired capacitor dielectric layer. In many of such applications, it will be highly desirable to utilize metal for the capacitor electrodes, thus forming a metal-insulator-metal capacitor. In other applications, it may still be desirable to use polysilicon as part of the capacitor electrode material using a conductive or other diffusion barrier, such as platinum, to avoid formation of insulative oxides of the electrode material.

One method of fabricating a capacitor is in the form of a container. A container forming material, typically borophosphosilicate glass (BPSG), is formed over a substrate. A container opening is formed within the container forming material. A conductive layer is formed to less than completely fill the container opening, thereby forming an upwardly open container-like shape received within the opening and outwardly thereof over the container forming material. Such layer or layers can be then be removed from outwardly of the container opening by polishing or other processes, thereby leaving an isolated conductive container construction within the opening which can be utilized as a capacitor storage electrode. This provides one way of forming a capacitor electrode in a desired shape using a single masking step for forming both the opening and ultimate patterning of individual capacitor electrodes received therein.

Certain materials are, however, extremely challenging to remove by the typical mechanical or chemical-mechanical polishing processes utilized to isolate the electrodes within the container openings. For example, platinum is difficult to polish when used as a lower electrode in a container style capacitor as it tends to "smear" during polish. It would be desirable to develop alternate capacitor fabrication methods which enable this problem to be alleviated. While the invention was motivated from this perspective, it is in no way so limited to addressing or overcoming any aspect of this particular problem, however. Further, while motivated and directed relative to fabrication problems associated with formation of the above-identified capacitor constructions, the invention is further not so limited. The invention is seen to have applicability to any method of patterning a metal layer utilizing any integrated circuit construction. The invention is only limited by the accompanying claims appropriately interpreted in accordance with the doctrine of equivalents, with the specification herein only providing but exemplary preferred embodiments.

SUMMARY

The invention comprises methods of forming a capacitor container electrode and methods of patterning a metal layer. In one implementation, a method of patterning a metal layer includes masking a first portion of a metal layer while leaving a second portion of the metal layer unmasked over a substrate. With the masking in place, the second portion is reacted with silicon to form a metal silicide from the metal layer. The metal silicide is removed from the substrate while substantially leaving the first portion on the substrate. The masking is removed from the substrate.

In one implementation, a method of patterning a metal layer includes depositing and patterning a silicon comprising layer over a substrate. A metal layer is formed over the patterned silicon comprising layer, and includes a portion extending to elevationally inward of the metal layer. Metal of the metal layer is reacted with silicon of the silicon layer to form a metal silicide and leave at least some of the portion unreacted. The metal silicide is removed from the substrate while substantially leaving the unreacted portion of the metal layer on the substrate.

These and other implementations can be used to form capacitor container electrodes and other circuit devices.

BRIEF DESCRIPTION OF THE DRAWINGS

Preferred embodiments of the invention are described below with reference to the following accompanying drawings.

FIG. 1 is a diagrammatic sectional view of a semiconductor wafer fragment in process in accordance with an aspect of the invention.

FIG. 2 is a view of the FIG. 1 wafer fragment at a processing step subsequent to that depicted by FIG. 1.

DETAILED DESCRIPTION OF THE PREFERRED EMBODIMENTS

Figure 3:
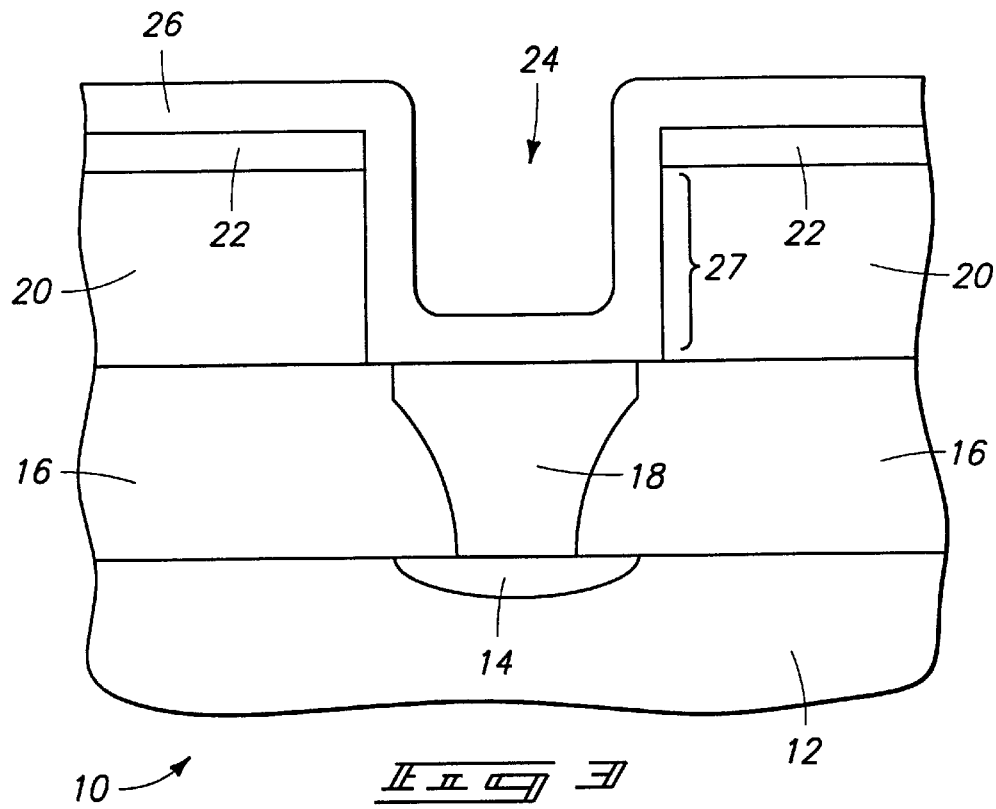
FIG. 3 is a view of the FIG. 1 wafer fragment at a processing step subsequent to that depicted by FIG. 2.

This disclosure of the invention is submitted in furtherance of the constitutional purposes of the U.S. Patent Laws "to promote the progress of science and useful arts" (Article 1, Section 8).

A substrate in the form of a semiconductor wafer fragment is indicated generally with reference numeral 10 in FIG. 1. Such is comprised of a semiconductive substrate in the form of a bulk monocrystalline silicon wafer 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" is intended to include both the singular and the plural. Wafer fragment 12 is preferably p–doped and includes an n+ conductive diffusion region 14 formed therein.

An electrically insulative layer 16 is formed over substrate 12. An electrically conductive plug 18 is diagrammatically shown formed therein over and in electrical connection with diffusion region 14. Such has been etched or otherwise planarized back to be flush with an outer upper planar surface of layer 16. In this illustrated and described example, plug 18 and diffusion region 14 constitute an exemplary node location formed on substrate 10 and to which electrical connection is desired with a capacitor electrode to be formed. A container forming material 20 is formed over node location 18/14 as a part of substrate 10, for example by chemical vapor deposition. Exemplary and preferred materials are electrically insulative materials, for example BPSG deposited to an exemplary thickness of about 10,000 Angstroms. A silicon comprising layer 22 is deposited over container forming material 20. An exemplary and preferred material is amorphous silicon deposited by chemical vapor deposition, or epitaxial silicon. In the context of this document, "substantially amorphous" means having an amorphous content greater than or equal to 90% amorphous phase. Polysilicon is an exemplary, lesser preferred material for layer 22. An example thickness for layer 22 is 300 Angstroms.

Referring to FIG. 2, a container opening 24 is formed in container forming material 20 over node location 18/14, preferably by photoresist deposition and patterning, and subsequent etch. Such provides but only one example of patterning silicon comprising layer 22.

Referring to FIG. 3, a conductive layer 26 comprising at least one of an elemental metal or metal alloy is formed over silicon comprising layer 22 and container forming material 20 to within container opening 24 and in electrical connection with node location 18/14. Conductive layer 26 ultimately less than completely fills container opening. 24. An exemplary thickness for layer 26 where container opening has a minimum open cross dimension of 2500 Angstroms, is 500 Angstroms. An example and preferred metal for layer 26 is elemental platinum or a metal alloy of platinum. By way of example only, alternate exemplary preferred materials for layer 26 include metal or metal alloys comprising a Group III metal. Further preferably, layer 26 consists essentially of an elemental metal or metal alloy. By way of example only, example alloys include Pt—Ir, Pt—Rh, and Pt—Ni. In such alloys, the platinum is preferably present at from 60 to 90 atomic percent, with the remaining element or elements being present at from 10% to 20%. Further, layer 26 is preferably deposited to be at least as thick as, and preferably thicker than, silicon comprising layer 22, with an example thickness for layer 26 being 500 Angstroms. Further as shown, conductive layer 26 is preferably formed on (in direct contact with) silicon comprising layer 22. Layer 26 can be deposited or otherwise formed by any conventional or yet-to-be-developed technique, with sputtering and chemical vapor deposition being but two examples. Further considered, FIG. 3 depicts but one example of forming a metal layer over patterned silicon comprising layer 22, with the metal layer including a portion 27 which extends to elevationally inward of silicon comprising layer 22.

Figure 4:
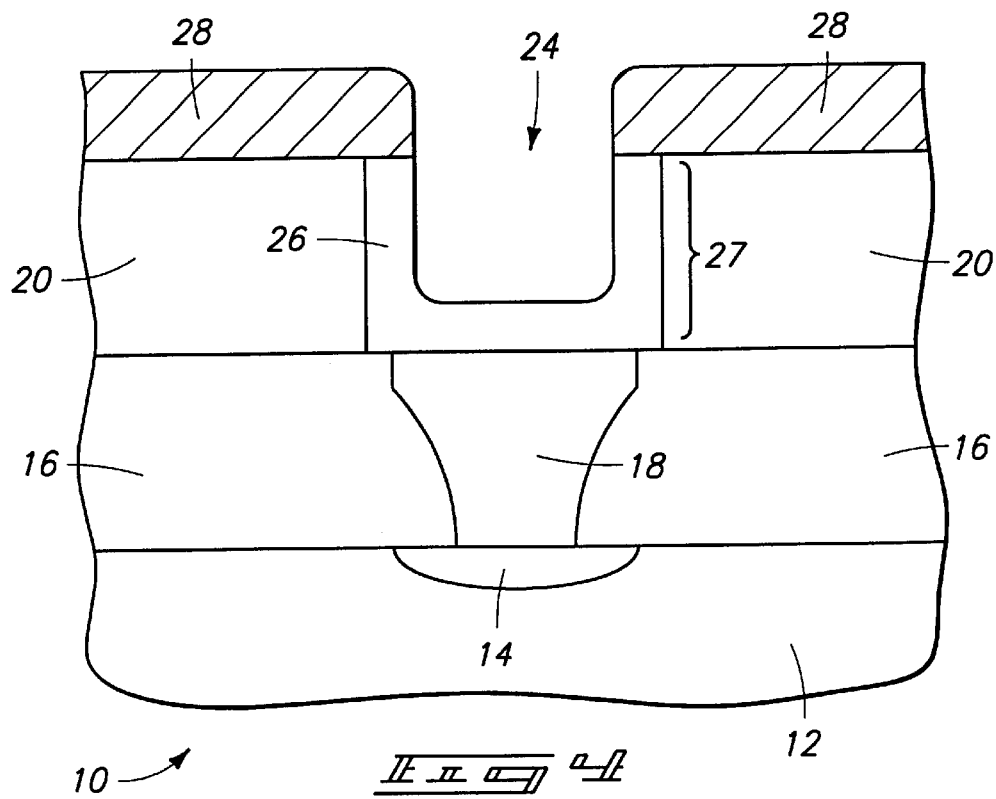
FIG. 4 is a view of the FIG. 1 wafer fragment at a processing step subsequent to that depicted by FIG. 3.

Referring to FIG. 4, the metal or metal alloy of conductive layer 26 (FIG. 3) is reacted with silicon of silicon comprising layer 22 to form a metal silicide 28 (FIG. 4) outwardly of container opening 24 and ultimately to leave at least some reacted conductive layer 26 within container opening 24. Such provides but one example of leaving at least some of portion 27 unreacted. Preferably, the silicon of layer 22 during such reacting is substantially amorphous, and the reacting preferably reacts substantially all of conductive layer 26 received over silicon comprising layer 22 into metal silicide 28, as shown. Further as shown, the reacting preferably reacts substantially all of silicon comprising layer 22 received under conductive layer 26 into metal silicide.

Exemplary preferred anneal conditions include a temperature of from about 300° C. to about 500° C. in an inert atmosphere, such as nitrogen, and at atmospheric pressure. Typical annealing times will be less than about 20 minutes, with from about 5 to 20 minutes being preferred. Different metal suicides might be formed depending upon the composition of metal layer 26. For example, annealing of a platinum layer in the presence of silicide at temperatures of less than or equal to about 300° C. typically results in the platinum silicide being formed as a mixture of $Pt_3Si$ and $Pt_4Si$. At annealing temperatures of around 400° C., the platinum silicide is typically formed to predominately be $Pt_2Si$. At temperatures of at least 450° C., the platinum silicide formed is typically in the form of PtSi. A preferred form of a platinum silicide formed in accordance with an aspect of the invention is $Pt_2Si$. Further as explained above, it is more desirable that all of the material of metal layer 26 above the silicon be completely converted to silicide, where it is less significant that all of the underlying silicon material be converted to silicide, as silicon is readily removable by the typical polishing action used to remove the conductive material from over layer 20 subsequently.

Figure 5:
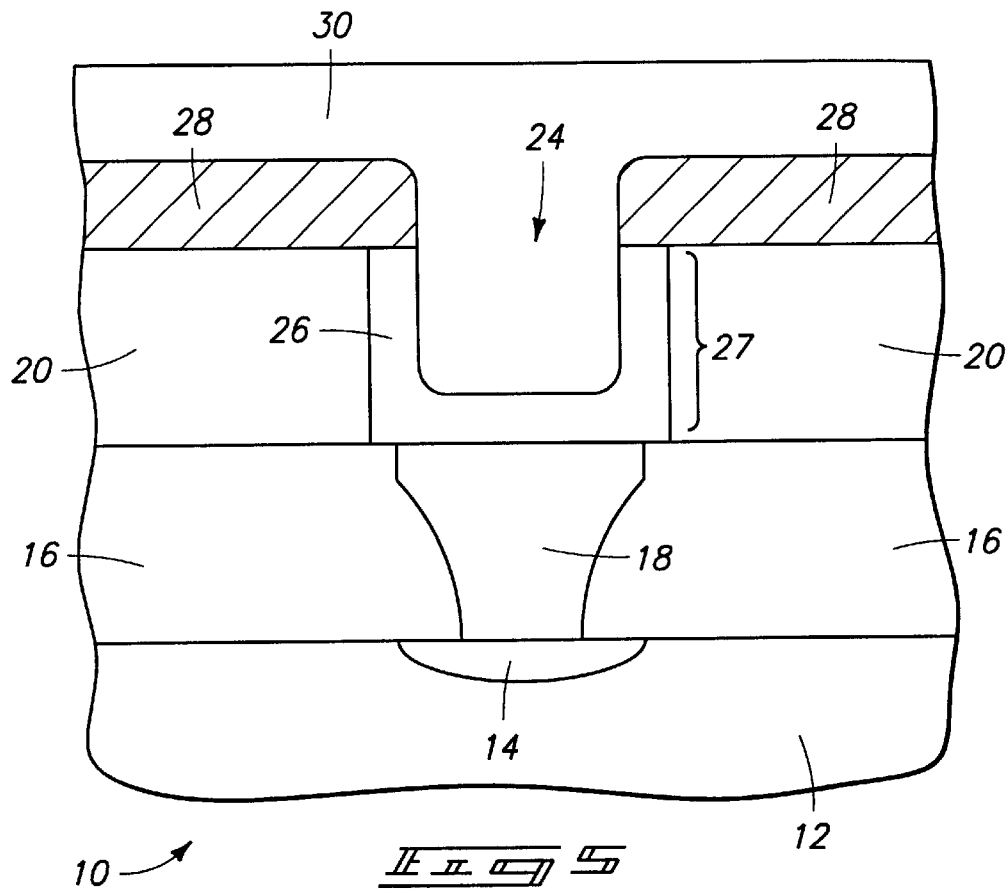
FIG. 5 is a view of the FIG. 1 wafer fragment at a processing step subsequent to that depicted by FIG. 4.

Referring to FIG. 5, a container plugging material, such as photoresist or spin-on glass, in the form of a layer 30, is preferably deposited over silicide layer 28 and to within container opening 24.

Figure 6:
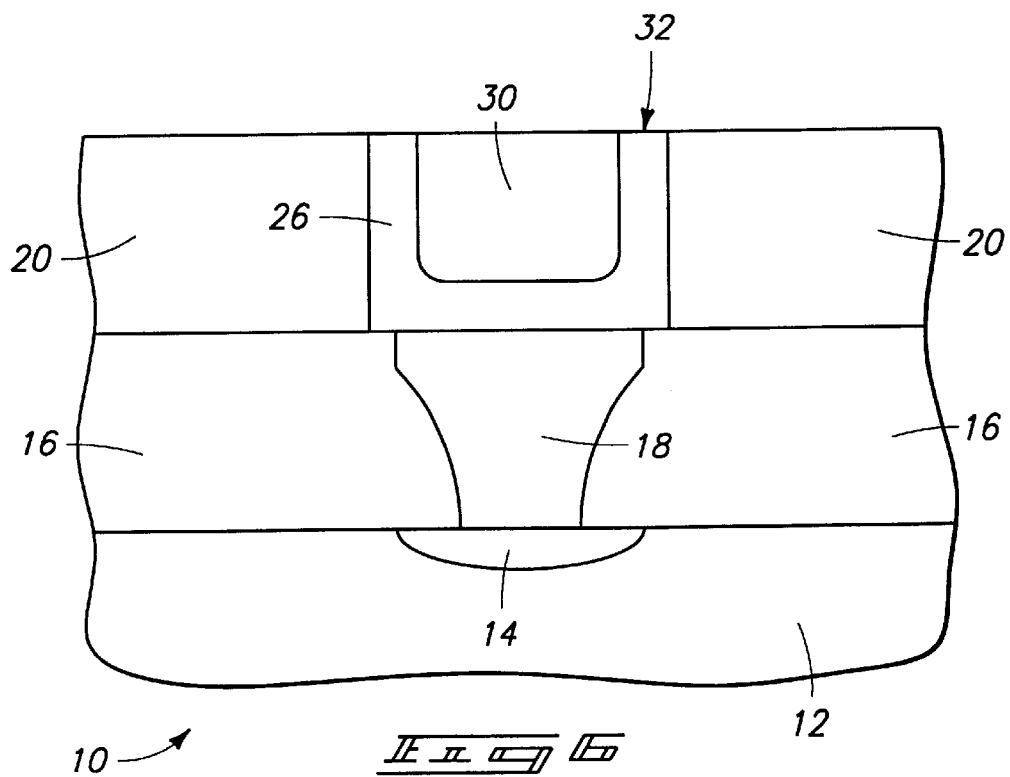
FIG. 6 is a view of the FIG. 1 wafer fragment at a processing step subsequent to that depicted by FIG. 5.
Figure 7:
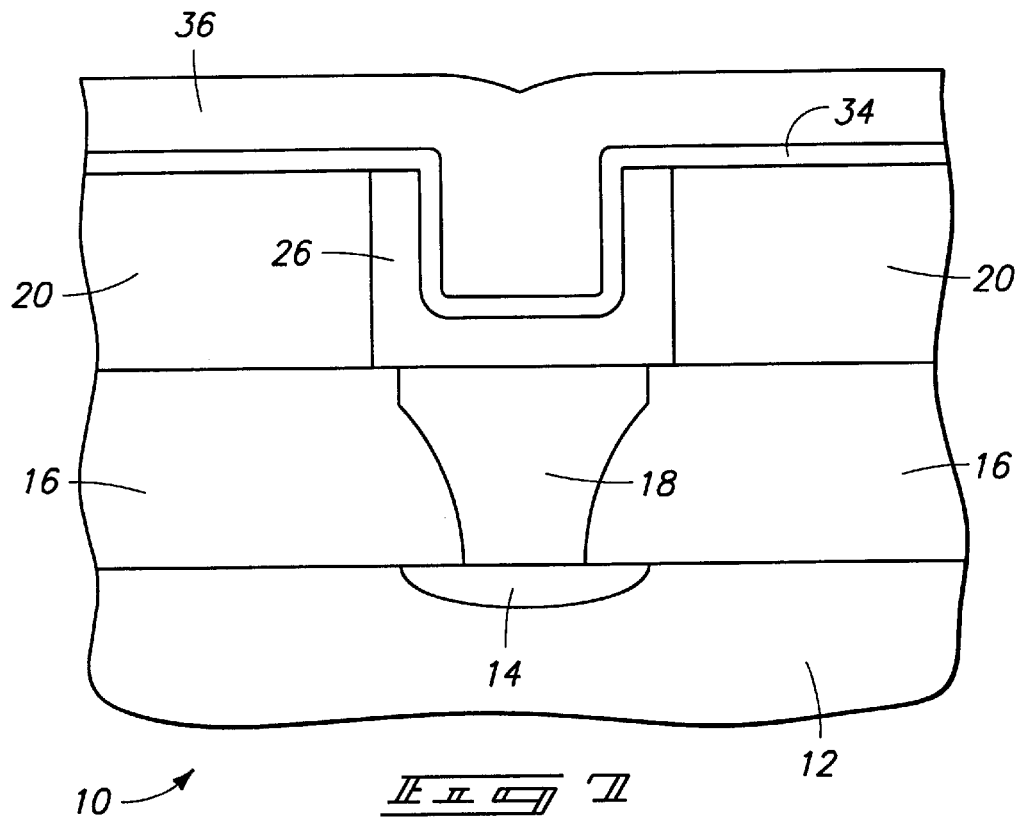
FIG. 7 is a view of the FIG. 1 wafer fragment at a processing step subsequent to that depicted by FIG. 6.

Referring to FIG. 6, metal silicide 28 from the substrate is removed outwardly of container opening 24, and a capacitor container electrode 32 is formed within container opening 24, substantially leaving unreacted portion 27. Preferably and not by way of limitation, the act of the removing is what forms capacitor container electrode 32 within container opening 24, and for such to be isolated relative to other structures or capacitor electrodes fabricated on the substrate at the same time. The preferred methods of removal include mechanical polishing and chemical-mechanical polishing, although chemical etching or any other removal is also contemplated. During such removal, the preferred implementation of the invention utilizing layer 30 provides protection of the conductive material within container opening 24 during the removal, and otherwise precludes polishing or removed material from getting to within the container which might be difficult to remove. Referring to FIG. 7, material 30 has been removed from the substrate. A capacitor dielectric layer 34 and an outer capacitor electrode layer 36 are formed over the substrate in a preferred implementation to produce a capacitor construction.

Figure 8:
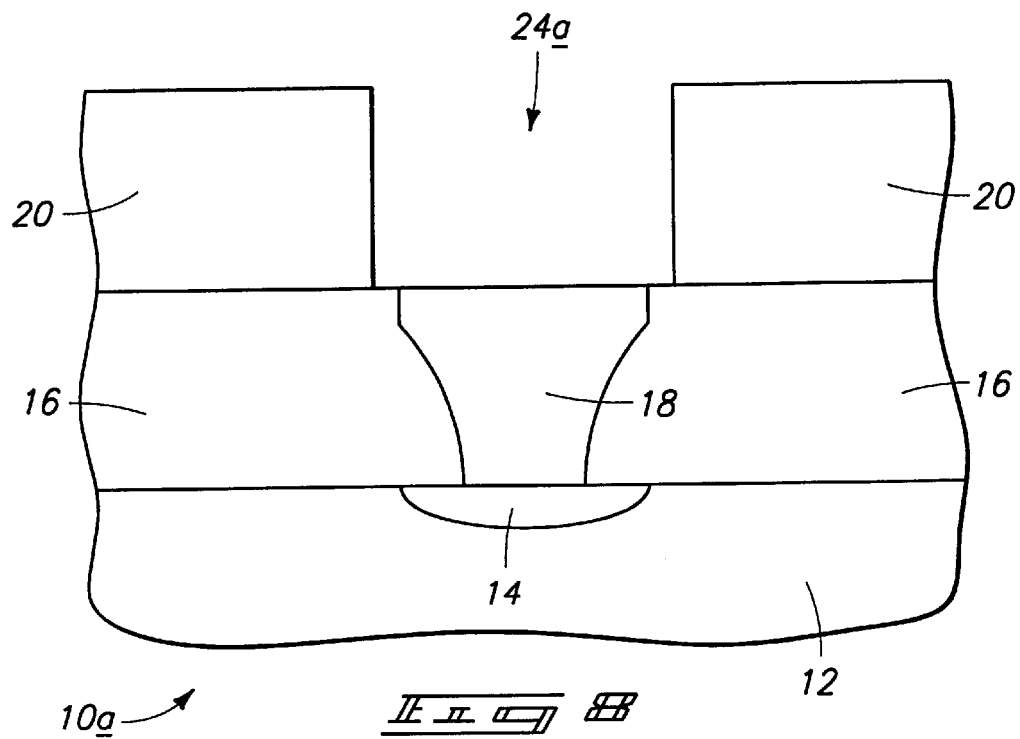
FIG. 8 is a diagrammatic sectional view of an alternate embodiment semiconductor wafer fragment in process in accordance with an aspect of the invention.

The FIGS. 1–7 embodiment provides but one example where the silicon utilized to produce the desired silicide region was previously formed on the substrate prior to the reacting, and where such silicon was derived from a silicon comprising layer deposited over the substrate before forming conductive layer 26. Alternate embodiments are, of course, contemplated. But one example first, alternate embodiment is next described with reference to FIGS. 8–12 wherein the silicon utilized for the reacting is in the gas phase, with preferably the silicon not being derived from silicon formed on the substrate. FIG. 8 depicts an alternate embodiment wafer fragment 10a. Like numerals from the first described embodiment are utilized where appropriate, with differences being indicated by the suffix "a" or with different numerals. FIG. 8 depicts a container opening 24a being formed in container forming material 20 over node location 18/14. In this particular exemplary embodiment, silicon comprising layer 22 of the first described embodiment has not been provided over capacitor forming layer 20.

Figure 9:
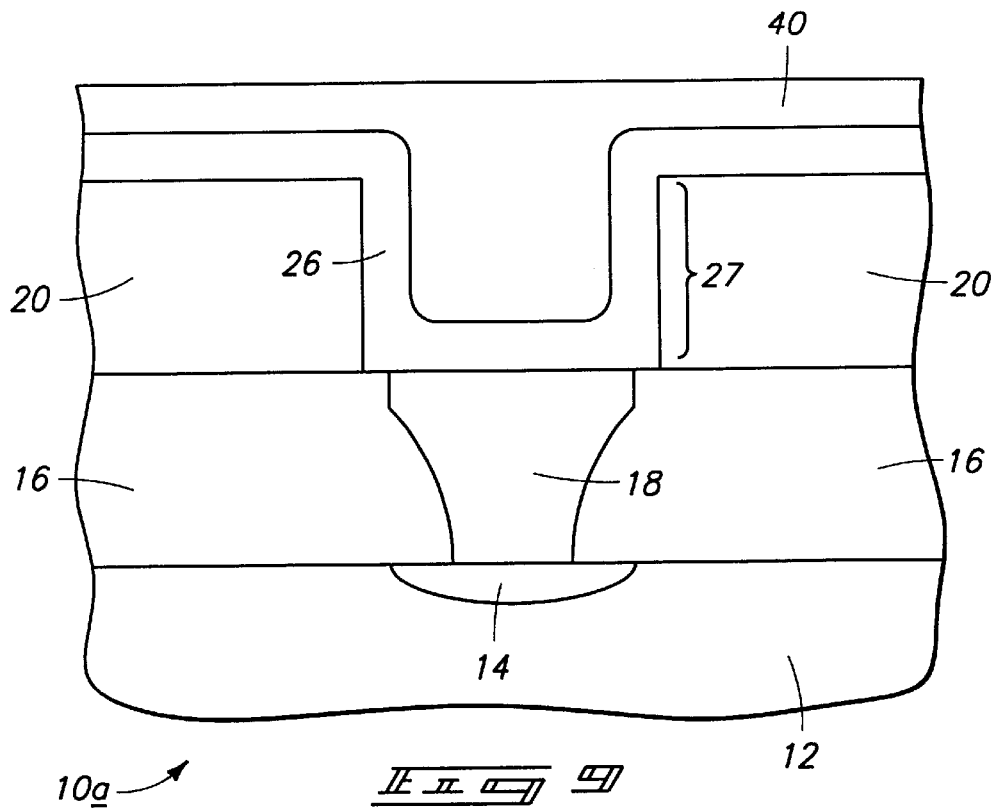
FIG. 9 is a view of the FIG. 8 wafer fragment at a processing step subsequent to that depicted by FIG. 8.

Referring to FIG. 9, conductive layer 26 comprising at least one of an elemental metal or metal alloy is formed over container forming material 20 to within container opening and ultimately in electrical connection with node location 18/14, preferably as provided above in the first described embodiment. A masking layer 40 is formed over conductive layer 26 and to within container opening 24a. Exemplary preferred materials for layer 40 include insulative materials, such as spin-on glass.

Figure 10:
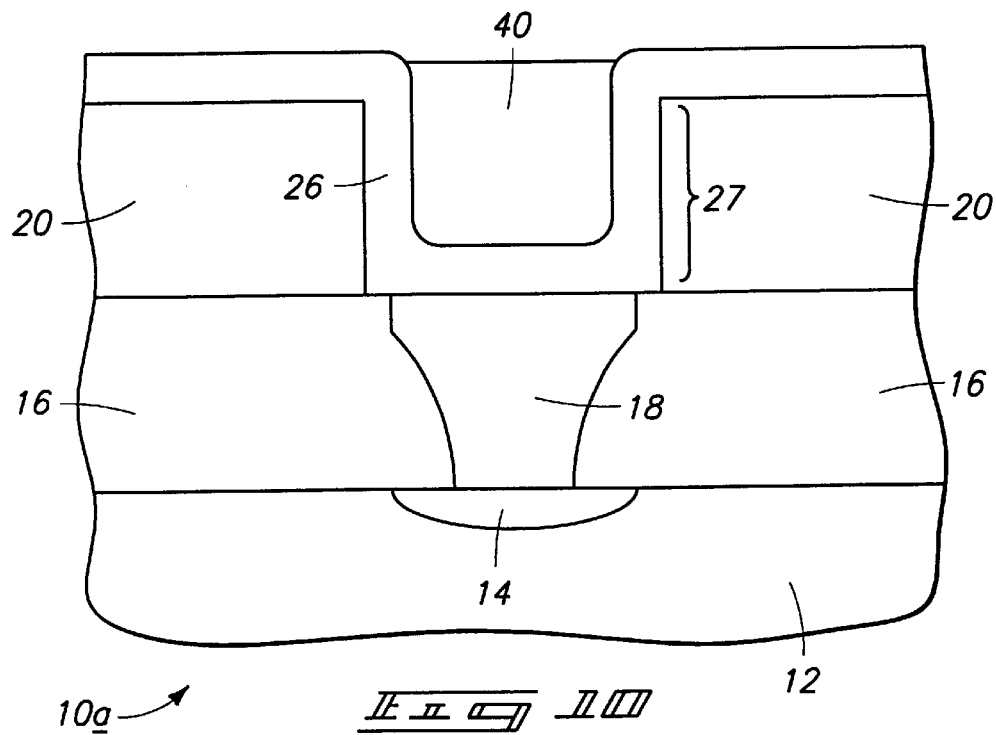
FIG. 10 is a view of the FIG. 8 wafer fragment at a processing step subsequent to that depicted by FIG. 9.

Referring to FIG. 10, masking layer 40 is planarized back preferably sufficiently to outwardly expose portions of conductive layer 26 which are received outwardly of container opening 24a. Such might occur by any known or yet-to-be-developed techniques, such as polishing action and/or chemical etching action. Further, some of material 26 may or may not be removed during such processing. FIG. 10 depicts but one example of masking at least some of conductive layer 26 which is received within container opening 24a, with all of such conductive layer within 24a being masked in the exemplary illustrated preferred embodiment. Preferably, at least a majority of conductive layer 26 within container opening 24a is masked. Accordingly further, FIG. 10 illustrates but one exemplary embodiment of masking of a first portion of metal layer 26 (i.e., that portion within container opening 24a and extending slightly elevationally outward thereof) while leaving a second portion of metal layer 26 unmasked (i.e., those portions received over and laterally outward of container opening 24a) over the substrate. In the illustrated and preferred embodiment, the first and second portions collectively define a non-planar topography.

Figure 11:
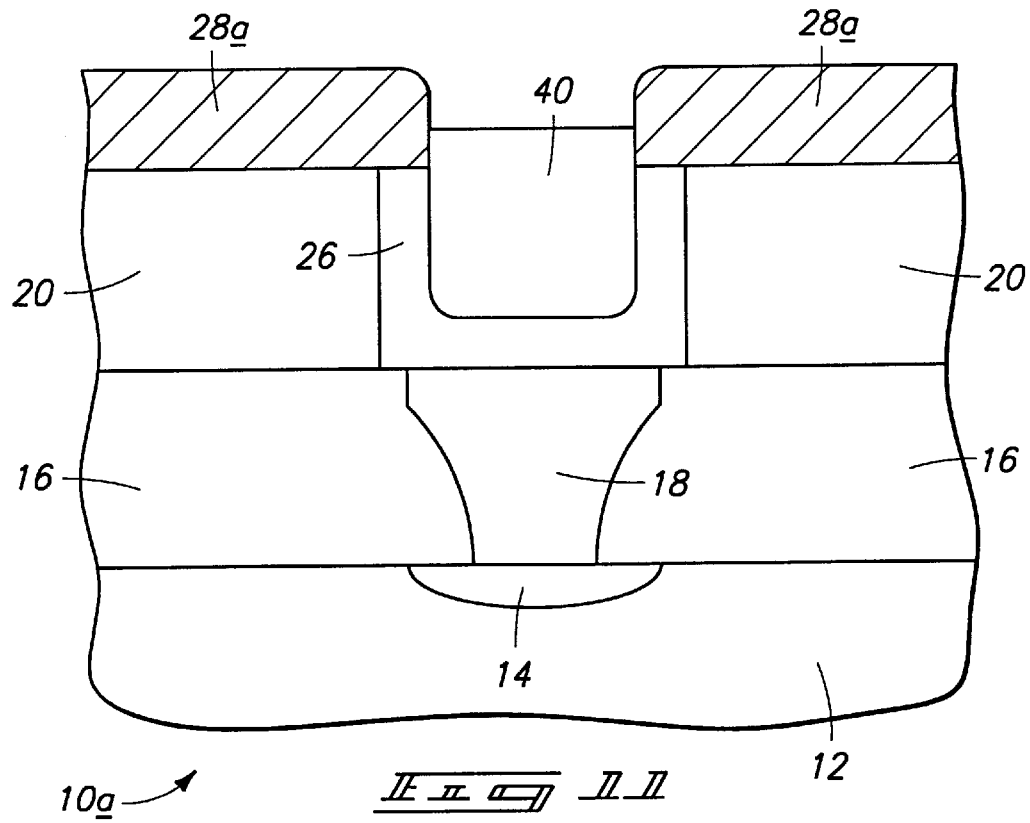
FIG. 11 is a view of the FIG. 8 wafer fragment at a processing step subsequent to that depicted by FIG. 10.

Referring to FIG. 11, and with at least some of masking 40 of FIG. 10 in place, silicon in a gaseous phase is reacted with the metal or metal alloy of conductive layer 26 to form a metal silicide 28a outwardly of container opening 24a, and ultimately to leave at least some unreacted conductive layer 26 within container opening 24a. An example process for doing so would be to expose the FIG. 10 substrate to a silicon comprising gas, such as a silane, at a temperature range from 300° C. to 450° C., under pressure conditions ranging from 3.0 Torr to 5.5 Torr, preferably for a time period suitable to transform all of exposed metal layer 26 to metal silicide material.

Figure 12:
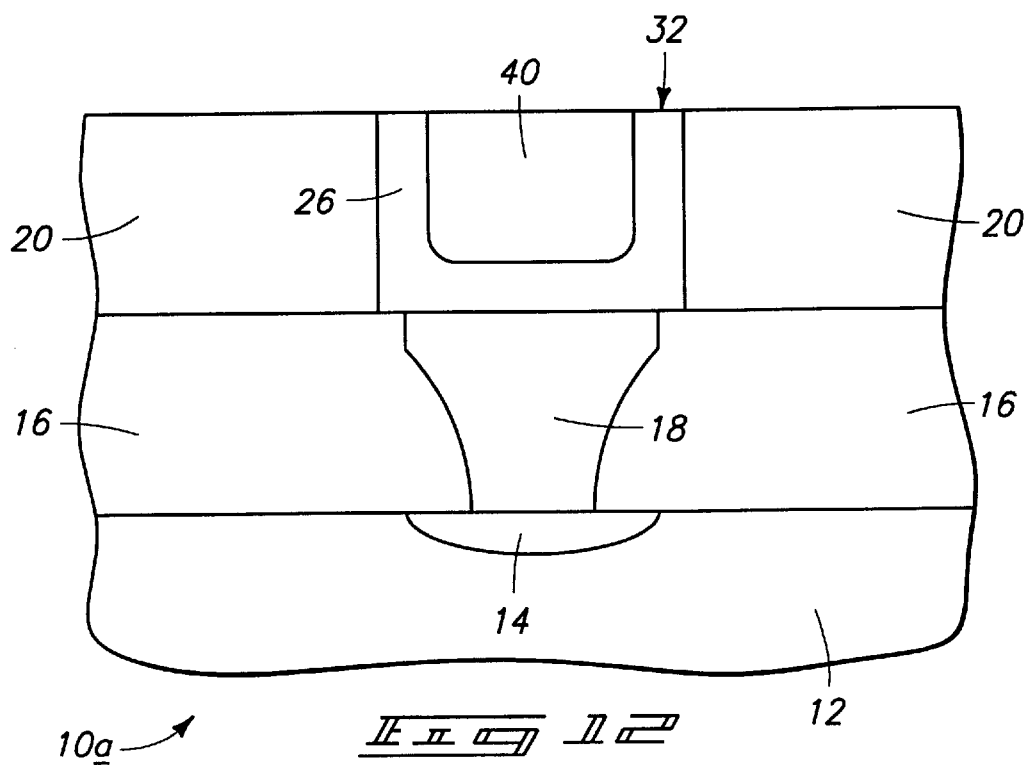
FIG. 12 is a view of the FIG. 8 wafer fragment at a processing step subsequent to that depicted by FIG. 11.

Referring to FIG. 12, the FIG. 11 construction has been processed to remove the metal silicide from the substrate outwardly of container opening 24a, and form a capacitor container electrode 32 within container opening 24a. Masking 40 would ultimately be removed from the substrate (not shown), and a capacitor construction preferably constructed therefrom in accordance with the FIG. 7 depiction, with the removing of the masking preferably being conducted after removing of the metal silicide.

The FIGS. 8–12 embodiment depicts but one example of reacting silicon with a metal or metal alloy layer on the substrate, with the s silicon at least partially being derived from silicon which is not on the substrate, with the example being silicon present in the gas phase during the reacting. The FIGS. 1–7 embodiment depicted an example of the silicon being derived from silicon of the substrate from a silicon comprising layer deposited over the substrate prior to forming the conductive layer. Silicon of the substrate is then reacted to form the silicide from a silicon comprising layer which is deposited over the substrate after forming the conductive layer.

Figure 13:
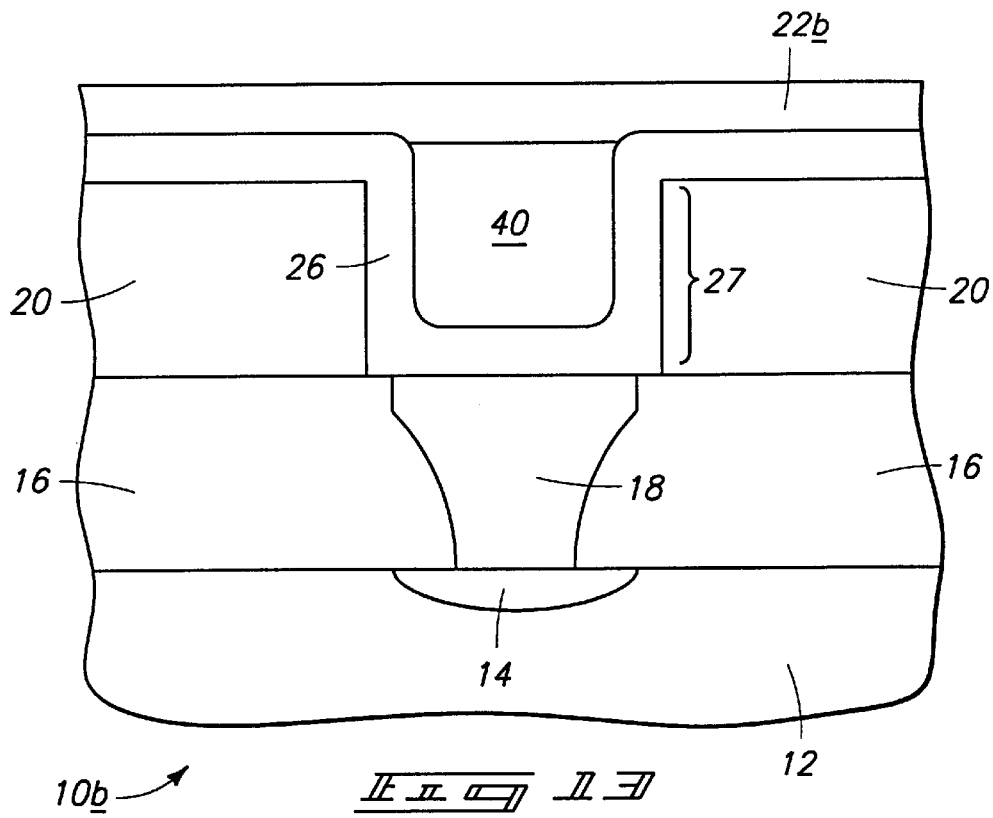
FIG. 13 is a diagrammatic sectional view of another alternate embodiment semiconductor wafer fragment in process in accordance with an aspect of the invention.

In yet but one additional embodiment, FIG. 13 depicts a wafer fragment 10b. Like numerals from the first and second described embodiments are utilized where appropriate, with differences being indicated with the suffix "b", or with different numerals. FIG. 13 depicts processing occurring subsequently to that depicted by FIG. 10 of the second described embodiment. With masking 40 in place, a silicon comprising layer 22b is deposited over metal layer 26, and over masking 40.

Figure 14:
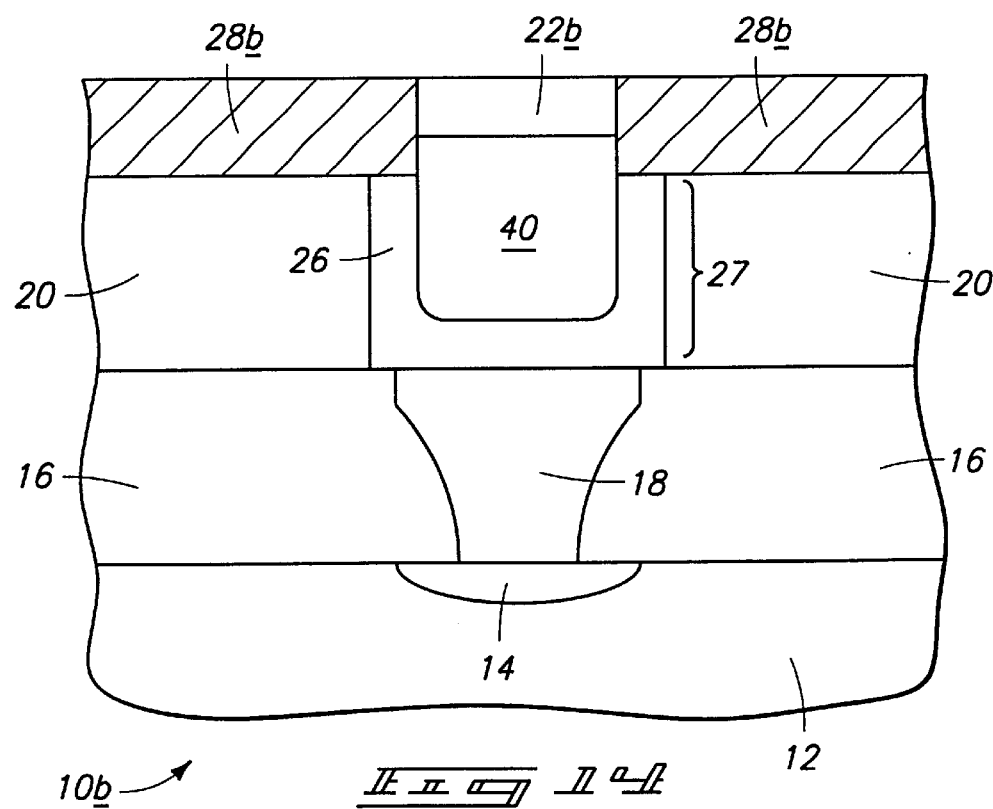
FIG. 14 is a view of the FIG. 13 wafer fragment at a processing step subsequent to that depicted by FIG. 13.

Referring to FIG. 14, and with masking 40 in place, silicon of silicon comprising layer 22b is reacted with the metal or metal alloy of conductive layer 26 to form metal silicide 28b outwardly of container opening 24b, and leaving at least some unreacted conductive layer 26 within container opening 24b. Processing is preferably conducted as described above in connection with the first described embodiment for fabrication of such metal silicide. Metal silicide 28b would ultimately be removed from the substrate outwardly of container opening, and preferably thereby forming a capacitor container electrode within the container opening for example as also described with respect to first described embodiment. Masking material 40 would then ultimately typically be removed from the substrate.

The invention has been described with respect to but three embodiments in fabrication of capacitor electrodes. The invention also contemplates any method of patterning a metal layer and of utilizing the above techniques as supported by the accompanying claims appropriately interpreted in accordance with the Doctrine of Equivalents.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor container electrode comprising;
    forming a container opening in a container forming material formed over a node location on a substrate;
    forming a conductive layer comprising at least one of an elemental metal or metal alloy over the container forming material to within the container opening in electrical connection with the node location, the conductive layer less than filling the container opening;
    reacting silicon of the substrate with the metal or metal alloy of the conductive layer to form a metal silicide outwardly of the container opening and to leave at least some unreacted conductive layer within the container opening; and
    removing the metal silicide from the substrate outwardly of the container opening and forming a capacitor container electrode within the container opening.

2. The method of claim 1 comprising forming the container forming material to be electrically insulative.

3. The method of claim 1 comprising forming the conductive layer to consist essentially of elemental metal, metal alloy or mixture thereof.

4. The method of claim 1 wherein the silicon of the substrate which is reacted is substantially amorphous.

5. The method of claim 1 wherein the silicon of the substrate which is reacted is from a silicon comprising layer deposited over the substrate before the forming the conductive layer.

6. The method of claim 1 wherein the silicon of the substrate which is reacted is from a silicon comprising layer deposited over the substrate after forming the conductive layer.

7. The method of claim 1 wherein the removing of the metal silicide comprises mechanical polishing.

8. The method of claim 1 wherein the removing of the metal silicide comprises chemical-mechanical polishing.

9. The method of claim 1 wherein the removing of the metal silicide comprises chemical etching.

10. The method of claim 1 wherein the metal or metal alloy comprises Pt, and the metal silicide comprises a platinum silicide.

11. The method of claim 1 wherein the metal or metal alloy comprises a Group III metal.

12. A method of forming a capacitor container electrode comprising;
    depositing a container forming material over a substrate;
    depositing a silicon comprising layer over the container forming material;
    etching a container opening through the silicon comprising layer and into the container forming material over a node location;
    forming a conductive layer comprising at least one of an elemental metal or metal alloy over the silicon comprising layer to within the container opening in electrical connection with the node location, the conductive layer less than filling the container opening;
    reacting the metal or metal alloy of the conductive layer with silicon of the silicon comprising layer to form a metal silicide outwardly of the container opening and to leave at least some unreacted conductive layer within the container opening; and
    removing the metal silicide from the substrate outwardly of the container opening and forming a capacitor container electrode within the container opening.

13. The method of claim 12 wherein the conductive layer is formed to be thicker than the silicon comprising layer.

14. The method of claim 12 wherein the conductive layer is formed on the silicon comprising layer.

15. The method of claim 12 wherein the silicon comprising layer as deposited is substantially amorphous.

16. The method of claim 12 wherein the silicon comprising layer during the reacting is substantially amorphous.

17. The method of claim 12 comprising forming the conductive layer to consist essentially of elemental metal, metal alloy or mixture thereof.

18. The method of claim 12 wherein the removing of the metal silicide comprises mechanical polishing.

19. The method of claim 12 wherein the removing of the metal silicide comprises chemical-mechanical polishing.

20. The method of claim 12 wherein the removing of the metal silicide comprises chemical etching.

21. The method of claim 12 wherein the reacting reacts substantially all of the conductive layer received over the silicon comprising layer into the metal silicide.

22. The method of claim 12 wherein the reacting reacts substantially all of the silicon comprising layer received under the conductive layer into the metal silicide.

23. The method of claim 12 wherein the metal or metal alloy comprises Pt, and the metal silicide comprises a platinum silicide.

24. The method of claim 12 wherein the metal or metal alloy comprises a Group III metal.

25. A method of forming a capacitor container electrode comprising;
    forming a container opening in a container forming material formed over a node location on a substrate;
    forming a conductive layer comprising at least one of an elemental metal or metal alloy over the container forming material to within the container opening in electrical connection with the node location, the conductive layer less than filling the container opening;

masking at least some of the conductive layer within the container opening;

with the masking in place, reacting silicon with the metal or metal alloy of the conductive layer to form a metal silicide outwardly of the container opening and to leave at least some unreacted conductive layer within the container opening;

removing the metal silicide from the substrate outwardly of the container opening and forming a capacitor container electrode within the container opening; and removing the masking after the reacting.

26. The method of claim 25 wherein removing the masking is conducted after the removing of the metal silicide.

27. The method of claim 25 wherein the masking is electrically insulative.

28. The method of claim 25 wherein the masking comprises spin on glass.

29. The method of claim 25 comprising masking at least a majority of the conductive layer within the container opening.

30. The method of claim 25 wherein the silicon is derived from a deposited silicon comprising layer.

31. The method of claim 25 wherein the silicon is derived from a deposited silicon comprising layer which is substantially amorphous.

32. The method of claim 25 wherein the silicon is in the gas phase.

33. The method of claim 25 wherein the metal or metal alloy comprises Pt, and the metal silicide comprises a platinum silicide.

34. The method of claim 25 wherein the metal or metal alloy comprises a Group III metal.

35. A method of forming a capacitor container electrode comprising;

forming a container opening in a container forming material formed over a node location on a substrate;

forming a conductive layer comprising at least one of an elemental metal or metal alloy over the container forming material to within the container opening in electrical connection with the node location, the conductive layer less than filling the container opening;

masking at least some of the conductive layer within the container opening;

with the masking in place, depositing a silicon comprising layer over the masking and the conductive layer;

reacting silicon of the silicon comprising layer with the metal or metal alloy of the conductive layer to form a metal silicide outwardly of the container opening and to leave at least some unreacted conductive layer within the container opening;

removing the metal silicide from the substrate outwardly of the container opening and forming a capacitor container electrode within the container opening; and removing the masking after the reacting.

36. The method of claim 35 wherein substantially all of the unmasked conductive layer reacts to form metal silicide.

37. The method of claim 35 wherein substantially all of the silicon comprising layer received over the conductive layer reacts to form metal silicide.

38. The method of claim 35 wherein the masking is electrically insulative.

39. The method of claim 35 wherein the masking comprises spin on glass.

40. The method of claim 35 comprising masking at least a majority of the conductive layer within the container opening.

41. The method of claim 35 wherein the metal or metal alloy comprises Pt, and the metal silicide comprises a platinum silicide.

42. The method of claim 35 wherein the metal or metal alloy comprises a Group III metal.

43. A method of patterning a metal layer comprising:

masking a first portion of a metal layer while leaving a second portion of the metal layer unmasked over a substrate, the first and second portions collectively define a non-planar topography;

with the masking in place, reacting the second portion with silicon to form a metal silicide from the metal layer;

removing the metal silicide from the substrate while substantially leaving the first portion on the substrate; and removing the masking from the substrate.

44. The method of claim 43 wherein the masking is electrically insulative.

45. The method of claim 43 wherein the masking comprises spin on glass.

46. The method of claim 43 wherein the silicon is derived from a deposited silicon comprising layer.

47. The method of claim 43 wherein the silicon is derived from a deposited silicon comprising layer which is substantially amorphous.

48. The method of claim 43 wherein the silicon is in the gas phase.

49. The method of claim 43 wherein the removing of the metal silicide comprises mechanical polishing.

50. The method of claim 43 wherein the removing of the metal silicide comprises chemical-mechanical polishing.

51. The method of claim 43 wherein the removing of the metal silicide comprises chemical etching.

52. The method of claim 43 wherein the metal layer comprises Pt, and the metal silicide comprises a platinum silicide.

53. The method of claim 43 wherein the metal layer comprises a Group III metal.

54. A method of patterning a metal layer comprising:

masking a first portion of a metal layer while leaving a second portion of the metal layer unmasked over a, substrate, the first and second portions collectively define a non-planar topography;

with the masking in place, depositing a silicon comprising layer over the metal layer;

reacting the second portion with silicon of the silicon comprising layer to form a metal silicide from the metal layer;

removing the metal silicide from the substrate while substantially leaving the first portion on the substrate; and removing the masking from the substrate.

55. The method of claim 54 wherein the metal layer is thicker than the silicon comprising layer.

56. The method of claim 54 wherein the silicon comprising layer as deposited is substantially amorphous.

57. The method of claim 54 wherein the silicon comprising layer during the reacting is substantially amorphous.

58. The method of claim 54 wherein substantially all of the unmasked metal layer reacts to form metal silicide.

59. The method of claim 54 wherein substantially all of the silicon comprising layer received over the metal layer reacts to form metal silicide.

60. The method of claim 54 wherein the masking is electrically insulative.

61. The method of claim 54 wherein the masking comprises spin on glass.

62. The method of claim 54 wherein the metal layer comprises Pt, and the metal silicide comprises a platinum silicide.

63. The method of claim 54 wherein the metal layer comprises a Group III metal.

64. A method of patterning a metal layer comprising:
 depositing and patterning a silicon comprising layer over a substrate;
 forming a metal layer over the patterned silicon comprising layer, the metal layer including a portion extending to elevationally inward of the silicon comprising layer;
 reacting metal of the metal layer with silicon of the silicon layer to form a metal silicide and leave at least some of the portion unreacted; and
 removing the metal silicide from the substrate while substantially leaving the unreacted portion of the metal layer on the substrate.

65. The method of claim 64 wherein the metal layer is formed on the silicon comprising layer.

66. The method of claim 64 wherein the silicon comprising layer as deposited is substantially amorphous.

67. The method of claim 64 wherein the silicon comprising layer during the reacting is substantially amorphous.

68. The method of claim 64 wherein the removing of the metal silicide comprises mechanical polishing.

69. The method of claim 64 wherein the removing of the metal silicide comprises chemical-mechanical polishing.

70. The method of claim 64 wherein the removing of the metal silicide comprises chemical etching.

71. The method of claim 64 wherein the reacting reacts substantially all of the metal layer received over the silicon comprising layer into the metal silicide.

72. The method of claim 64 wherein the reacting reacts substantially all of the silicon comprising layer received under the metal layer into the metal silicide.

73. The method of claim 64 wherein the metal layer comprises Pt, and the metal silicide comprises a platinum silicide.

74. The method of claim 64 wherein the metal layer comprises a Group III metal.

* * * * *

UNITED STATES PATENT AND TRADEMARK OFFICE
CERTIFICATE OF CORRECTION

PATENT NO.     : 6,372,574 B1
DATED          : April 16, 2002
INVENTOR(S)    : Richard H. Lane et al.

It is certified that error appears in the above-identified patent and that said Letters Patent is hereby corrected as shown below:

Column 6,
Line 52, replace "with the s silicon at least" with -- with the silicon at least --

Signed and Sealed this

Seventeenth Day of December, 2002

JAMES E. ROGAN
*Director of the United States Patent and Trademark Office*